United States Patent
Kawamura

(10) Patent No.: US 11,780,855 B2
(45) Date of Patent: Oct. 10, 2023

(54) 2-(2'-DIARYLAMINOPHENYL) BORABENZENE DERIVATIVE AND ORGANIC ELECTRONIC DEVICE INCLUDING THE DERIVATIVE

(71) Applicant: LG CHEM, LTD., Seoul (KR)

(72) Inventor: Hisayuki Kawamura, Tokyo (JP)

(73) Assignee: LG Chem, Ltd., Seoul (KR)

( * ) Notice: Subject to any disclaimer, the term of this patent is extended or adjusted under 35 U.S.C. 154(b) by 731 days.

(21) Appl. No.: 16/960,859

(22) PCT Filed: Sep. 14, 2018

(86) PCT No.: PCT/KR2018/010850
§ 371 (c)(1),
(2) Date: Jul. 8, 2020

(87) PCT Pub. No.: WO2019/146869
PCT Pub. Date: Aug. 1, 2019

(65) Prior Publication Data
US 2021/0053994 A1    Feb. 25, 2021

(30) Foreign Application Priority Data
Jan. 25, 2018 (JP) .................. 2018-010463

(51) Int. Cl.
C07F 5/02 (2006.01)
H10K 85/30 (2023.01)
H10K 50/15 (2023.01)

(52) U.S. Cl.
CPC ............ *C07F 5/02* (2013.01); *H10K 85/322* (2023.02); *H10K 50/15* (2023.02)

(58) Field of Classification Search
None
See application file for complete search history.

(56) References Cited

U.S. PATENT DOCUMENTS

| | | | |
|---|---|---|---|
| 2013/0112950 A1 | 5/2013 | Yokoyama et al. | |
| 2014/0084260 A1 | 3/2014 | Xia et al. | |
| 2018/0138407 A1 | 5/2018 | Clark et al. | |
| 2018/0298034 A1 | 10/2018 | Lee et al. | |

FOREIGN PATENT DOCUMENTS

| | | |
|---|---|---|
| CN | 107531729 | 1/2018 |
| JP | 2008-120769 | 5/2008 |
| JP | 2012-151149 | 8/2012 |
| JP | 2015-070094 | 4/2015 |
| JP | 2017-109929 | 6/2017 |
| WO | 2012-001986 | 1/2012 |
| WO | 2016-144106 | 9/2016 |
| WO | 2016178827 | 11/2016 |

OTHER PUBLICATIONS

Shiu et al., "Efficient thermally activated delayed fluorescence of functional phenylpyridinato boron complexes and high performance organic light-emitting diodes," Journal of Materials Chemistry C, 2017, pp. 1452-1462, vol. 5, issue 6.
Ishida et al., "Synthesis of Pyridine—Borane Complexes via Electrophilic Aromatic Borylation," The Journal of Organic Chemistry, published on web Nov. 23, 2010, pp. 8709-8712, vol. 75, No. 24.
Wang, J. Y. and Pei, J., "BN-embedded aromatics for optoelectronic applications," Chinese Chemical Letters, published online Jun. 14, 2016, pp. 1139-1146, vol. 27.
Jaska et al., "Triphenylene Analogues with B2N2C2 Cores: Synthesis, Structure, Redox Behavior, and Photophysical Properties," J. Am. Chem. Soc., published on web Aug. 1, 2006, pp. 10885-10896, vol. 128.
Hoic et al., "Chemistry of Borabenzene: Efficient and General Synthesis of New Neutral Borabenzene—Ligand Complexes," Organometallics, 1996, pp. 1315-1318, vol. 15.
Legare et al., "Insights into the Formation of Borabenzen Adducts via Ligand Exchange Reactions and TMSCI Elimination from Boracyclohexadiene Precursors," Organometallics, published Jun. 18, 2014, pp. 3596-3606, vol. 33.
Adeyeye, M. and Ventura, N., "A SIP-based web client for HTTP session mobility and multimedia services," Computer Communications 33: 954-964 (2010).

*Primary Examiner* — Dylan C Kershner
*Assistant Examiner* — Seokmin Jeon
(74) *Attorney, Agent, or Firm* — Bryan Cave Leighton Paisner LLP

(57) ABSTRACT

A compound useful as a hole transport material for an organic electronic device, in particular, an organic electroluminescent (EL) device. The compound of the present specification is represented by the following General Formula (1).

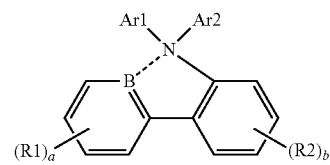

15 Claims, 1 Drawing Sheet

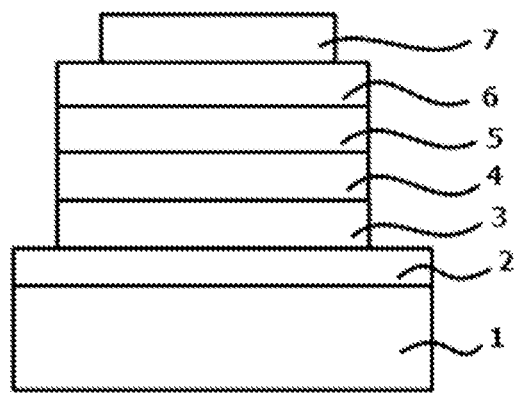

2-(2'-DIARYLAMINOPHENYL) BORABENZENE DERIVATIVE AND ORGANIC ELECTRONIC DEVICE INCLUDING THE DERIVATIVE

This application is a National Stage Application of International Application No. PCT/KR2018/010850 filed on Sep. 14, 2018, which claims priority to and the benefits of Japanese Patent Application No. 2018-010463, filed with the Japanese Intellectual Property Office on Jan. 25, 2018, the entire contents of which are incorporated herein by reference.

TECHNICAL FIELD

The present specification relates to a 2-(2'-diarylaminophenyl)borabenzene derivative of the following General Formula (1):

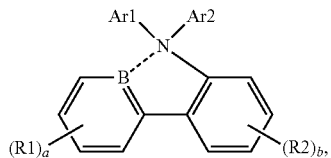

General Formula (1)

an organic electronic device, in particular, an organic electroluminescent device (organic EL device) including the derivative, and use of the derivative as a hole injection/transport material, a host material for a light emitting layer, and/or a material for an electron/exciton blocking layer.

BACKGROUND

An organic electronic device refers to a device that requires charge transport between an electrode and an organic material layer constituting the device, using holes and/or electrons. Depending on operational principle, an organic electronic device may be broadly classified into the following two types. The first type of device is an electronic device having a configuration in which excitons are formed in an organic material layer by photons incident upon the device from an external light source, the excitons are split into electrons and holes, and the electrons and the holes are separately transported to different electrodes to generate electromotive force which is used to operate this type of device. The second type of device is an electronic device having a configuration in which, by applying a voltage to two or more different electrodes or applying a current to the device, holes and/or electrons are injected into organic semiconductor layers contacting respective electrodes, and injected electrons and holes are used to operate this type of device. The first type of device, for example, includes organic solar cells and organic photoconductors (OPCs). The second type of device, for example, includes organic light emitting devices, more specifically, organic electroluminescent (EL) devices, and organic transistors.

Among the organic electronic devices, organic EL devices generally have a structure including an anode, a cathode and an organic material layer including a light emitting layer disposed between these electrodes. In such an organic EL device, light is emitted from a light emitting material, based on an energy of excitons generated upon recombination between holes and electrons injected from the anode and the cathode, respectively. Here, in general, the organic material layer of the organic EL device has a multi-layer structure including a plurality of layers containing different materials having respective different functions to improve characteristics, for example, luminous efficacy, of the organic EL device, and the plurality of layers include, for example, a hole injection layer, a hole transport layer, a light emitting layer, an electron transport layer, an electron injection layer and the like. However, any one of these layers may perform several functions and some thereof may thus be omitted. Further, in addition to these organic material layers, the organic material layer of the organic EL device may further include a planarization layer to improve the evenness of electrode surfaces, and a hole blocking layer, an electron blocking layer, and/or an exciton blocking layer to confine holes, electrons, and/or excitons to the light emitting layer.

When a voltage is applied between two electrodes in the organic EL device having this configuration, holes and electrons are injected into the organic material layer from the anode and the cathode, respectively, excitons having an energy higher than an energy of the ground state of a light emitting molecule are formed in the light emitting molecule upon combination of the injected holes and electrons, and light is emitted when these excitons return to the ground state. Such an organic EL device is a self-luminescent device, which is known to have properties such as high luminance, high efficacy, low operation voltage, wide viewing angle, high contrast and rapid response, as compared to conventional liquid crystal devices using a backlight.

Materials used for organic material layers in organic EL devices may be classified into light emitting materials and charge injection/transport materials, for example, hole injection materials, hole transport materials, electron transport materials, electron injection materials and the like, depending on function of the layer. In addition, light emitting materials may be classified into blue, green and red light emitting materials, and yellow and orange light emitting materials required to provide better natural color, depending on color of emitted light. Meanwhile, when the light emitting layer is formed using only one material, the maximum emission wavelength is shifted to a long wavelength due to intermolecular interaction, which may cause problems of deteriorated color purity and deteriorated device efficacy due to attenuation (decay) of light emission. Accordingly, in order to enhance color purity for excellent light emission and luminous efficacy, a host/dopant-based material including a light emitting material and a host material may be used for the light emitting layer.

In order for the organic EL device to exert excellent characteristics such as high efficacy, a material constituting the organic material layer of the device, for example, a material selected from a hole injection material, a hole transport material, a light emitting material, an electron transport material, an electron injection material and the like needs to include a material that is stable and efficiently performs such a function for as long as possible in the device.

As the hole transport material used for the organic material layer of the organic EL device, an aromatic amine compound, for example, NPB (N,N'-bis(naphthalen-1-yl)-N,N'-bis(phenyl)-benzidine), TPD (N,N-bis(3-methylphenyl)-N,N-bis(phenyl)-benzidine), α-NPD (N,N-di(1-naphthyl)-N,N'-diphenylbenzidine), TAPC (1,1-bis[4-[N,N-di(p-tolyl)amino]phenyl]cyclohexane] and the like are well-known. As the hole transport material, an organic compound having a carbazole ring structure has been actively researched since it has a high excited triplet level Ti derived from the carbazole ring structure and excellent hole transport capability. For example, Japanese Patent Application Publication No. 2008-120769 discloses use of an N-aryl-substituted carbazole compound as a hole injection/transport material for an organic EL device. Further, PCT Publication WO 2012/001986 discloses use of a compound having a structure in which two or more carbazole rings are bonded to one another as a hole injection/transport material for an organic EL device. In addition, Japanese Patent Application Publication No. 2017-109929 discloses use of an N-arylcarbazole derivative having a diarylamino substituent as a hole injection/transport material for an organic EL device.

Technical Problem

As described above, although aromatic amine compounds having various chemical structures have been researched and developed to date as hole transport materials for organic electronic devices, for example, organic EL devices, there is still a need for development of materials having better characteristics or materials having a novel chemical structure unknown to date. Thus, the present specification is directed to providing a novel material useful as a hole transport material for an organic electronic device, in particular, an organic electroluminescent device.

Technical Solution

One embodiment of the present specification provides a compound represented by the following General Formula (1). In addition, the compound of General Formula (1) is suitable for use as a hole transport material for an organic electronic device. Also, another embodiment of the present specification provides an organic electronic device, in particular, an organic EL device, including an organic material layer including the compound of General Formula (1).

The compound of the present specification is of the following General Formula (1):

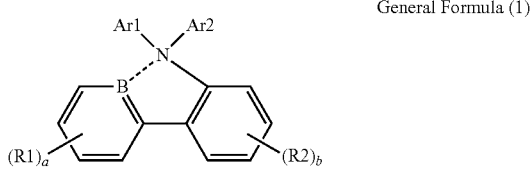

General Formula (1)

wherein R1 and R2 are identical to or different from each other and each independently represent a substituent at any substitutable position on a borabenzene ring or benzene ring selected from the group consisting of: a deuterium atom; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted trialkylsilyl group; a substituted or unsubstituted triarylsilyl group; a substituted or unsubstituted dialkylboron group; a substituted or unsubstituted diarylboron group; a substituted or unsubstituted mono- or di-alkylamino group; a substituted or unsubstituted mono- or di-aralkylamino group; a substituted or unsubstituted mono- or di-arylamino group; a substituted or unsubstituted mono- or di-heteroarylamino group; a substituted or unsubstituted, condensed or uncondensed aryl group; and a substituted or unsubstituted, condensed or uncondensed heteroaryl group;

a and b each independently represent an integer of 0 to 4;

Ar1 and Ar2 are identical to or different from each other, and each independently represent a substituted or unsubstituted, uncondensed or condensed aryl group having 6 to 30 ring carbon atoms or a substituted or unsubstituted, uncondensed or condensed heteroaryl group having 5 to 30 ring atoms; and Ar1 and Ar2 are optionally bonded to each other via a linker selected from the group consisting of a single bond, an alkylene group, an alkenylene group, —O—, —S—, an alkyl-N group, an aryl-N group, a dialkyl Si group, and a diaryl Si group.

In General Formula (1), particularly preferably, both a and b are 0 (zero), that is, substituents represented by R1 and R2 do not exist.

In each aforementioned embodiment, in the case in which R1 and R2 substituents are present, R1 and R2 are preferably each independently selected from the group consisting of a deuterium atom, a substituted or unsubstituted linear or branched alkyl group, a substituted or unsubstituted cycloalkyl group, and a substituted or unsubstituted aryl group, and Ar1 and Ar2 are preferably each independently selected from the group consisting of substituted or unsubstituted phenyl group, biphenyl group, terphenyl group, fluorenyl group, spirobifluorenyl group, naphthyl group, anthracenyl group, phenanthrenyl group, fluoranthenyl group, pyrenyl group, chrysenyl group, triphenylenyl group, perylenyl group, indenyl group, benzoindenyl group, pyrrolyl group, indolyl group, carbazolyl group, furanyl group, benzofuranyl group, dibenzofuranyl group, thiophenyl group, benzothiophenyl group, dibenzothiophenyl group, imidazolyl group, benzoimidazolyl group, triazolyl group, oxazolyl group, oxadiazolyl group, thiazolyl group, thiadiazolyl group, pyridyl group, pyrimidyl group, triazinyl group, quinolinyl group and quinoxalinyl group.

In each aforementioned embodiment, more preferably, Ar1 and Ar2 are each independently selected from the group consisting of substituted or unsubstituted, phenyl group, biphenyl group, terphenyl group, fluorenyl group, naphthyl group and phenanthrenyl group.

In General Formula (1), when R1, R2, Ar1, and Ar2 are groups having a substituent, the substituent is preferably each independently selected from the group consisting of a deuterium atom, a halogen atom (for example, fluorine, chlorine or bromine atom), a cyano group, a nitro group, a linear or branched alkyl group having 1 to 6 carbon atoms, a cycloalkyl group having 3 to 6 carbon atoms, an alkoxy group having 1 to 6 carbon atoms, an aryl group having 6 to 30 ring carbon atoms, a heteroaryl group having 5 to 30 ring atoms, an aryloxy group having 6 to 30 ring carbon atoms, a heteroaryloxy group having 5 to 30 ring atoms, a mono- or di-substituted amino group having an aryl group having 6 to 30 ring carbon atoms or a heteroaryl group having 5 to 30 ring atoms as a substituent, and a triarylsilyl or triheteroarylsilyl group having an aryl group having 6 to 30 ring carbon atoms or a heteroaryl group having 5 to 30 ring atoms as a substituent.

In addition, the substituents that R1, R2, Ar1, and Ar2 may have are preferably each independently selected from the group consisting of a deuterium atom, an aryl group having 6 to 30 ring carbon atoms, a monoarylamino group or diarylamino group, in which the aryl group is an aryl group having 6 to 30 ring carbon atoms, and a triarylsilyl group, in which the aryl group is an aryl group having 6 to 30 ring carbon atoms.

Preferred examples of the compound of General Formula (1) include compounds given below:

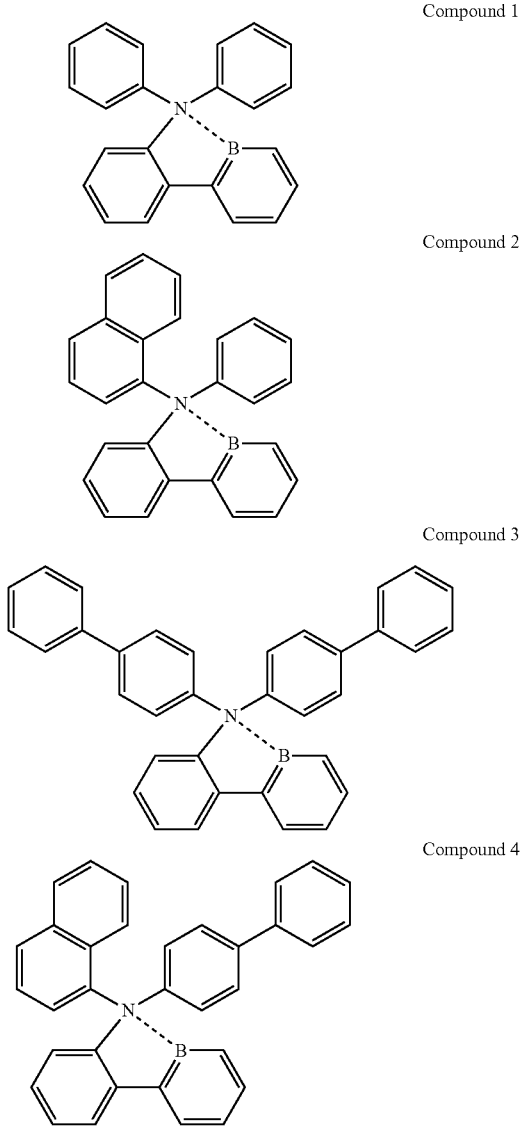

Compound 1

Compound 2

Compound 3

Compound 4

Another embodiment of the present specification also provides an organic material for an organic electronic device including the compound of General Formula (1). The organic electronic device is particularly preferably an organic electroluminescent device (organic EL device).

The organic material is preferably a hole transport material. Accordingly, another embodiment of the present specification provides a hole transport material for an organic electronic device including the compound of General Formula (1). The organic electronic device is particularly preferably an organic electroluminescent device (organic EL device). Use of the hole transport material in the present specification also includes use thereof as a hole injection material. The reason for this is that holes injected into the hole injection layer can be transported to other organic material layers adjacent to the hole injection layer and a material for the hole injection layer can thus serve as a hole transport material as well.

Another embodiment of the present specification also provides an organic electronic device including the compound of General Formula (1). The organic electronic device is particularly preferably an organic electroluminescent device (organic EL device). Another embodiment of the present specification also provides an organic electronic device including a hole transport layer wherein the hole transport layer includes the compound of General Formula (1) as a hole transport material. The organic electronic device is particularly preferably an organic electroluminescent device (organic EL device).

Advantageous Effects

The compound of the present specification can be used as a hole transport material for an organic photoelectric device, in particular, an organic EL device.

BRIEF DESCRIPTION OF THE DRAWINGS

FIG. 1 illustrates a general structure of an organic EL device.
1: Substrate
2: Anode
3: Hole Injection Layer
4: Hole Transport Layer
5: Light Emitting Layer
6: Electron Transport Layer
7: Cathode

DETAILED DESCRIPTION

Hereinafter, an embodiment of the present specification will be described in more detail. In General Formula (1) given above, General Formula (1)

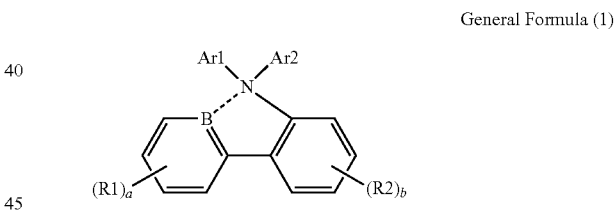

R1 and R2 represent a substituent at any substitutable position on a borabenzene ring or benzene ring, when R1 and R2 exist, that is, both a and b are not 0 (zero), R1 and R2 are identical to or different from each other and are each independently selected from the group consisting of: a deuterium atom; a substituted or unsubstituted alkyl group, in particular, a linear or branched alkyl group having 1 to 6 carbon atoms; a substituted or unsubstituted cycloalkyl group, in particular, a cycloalkyl group having 3 to 6 ring carbon atoms; a substituted or unsubstituted alkoxy group, in particular, a linear or branched alkoxy group having 1 to 6 carbon atoms or a cycloalkyloxy group having 3 to 10 carbon atoms; a substituted or unsubstituted aryloxy group, in particular, an aryloxy group having 6 to 30 ring carbon atoms; a substituted or unsubstituted alkylthio group, in particular, a linear or branched alkylthio group having 1 to 6 carbon atoms or a cycloalkylthio group having 3 to 10 carbon atoms; a substituted or unsubstituted arylthio group, in particular, an arylthio group having 6 to 30 ring carbon atoms; a substituted or unsubstituted trialkylsilyl group (in particular, the alkyl group is an alkyl group having 1 to 6 carbon atoms); a substituted or unsubstituted triarylsilyl group (in particular, the aryl group is an aryl group having 6 to 30 ring carbon atoms); a substituted or unsubstituted dialkyl boron group (in particular, the alkyl group is a linear or branched alkyl group having 1 to 6 carbon atoms or a cycloalkyl group having 3 to 10 carbon atoms); a substituted or unsubstituted diarylboron group (in particular, the aryl group is an aryl group having 6 to 30 ring carbon atoms); a substituted or unsubstituted mono- or di-alkylamino group (in particular, the alkyl group is a linear or branched alkyl group having 1 to 6 carbon atoms or a cycloalkyl group having 3 to 10 carbon atoms); a substituted or unsubstituted mono- or di-aralkylamino group (in particular, the aryl moiety of the aralkyl group is an aryl group having 6 to 30 ring carbon atoms, and the alkyl moiety of the aralkyl group is a linear or branched alkyl group having 1 to 6 carbon atoms); a substituted or unsubstituted mono- or di-arylamino group (in particular, the aryl group is an aryl group having 6 to 30 ring carbon atoms); a substituted or unsubstituted mono- or di-heteroarylamino group (in particular, the number of ring atoms of the heteroaryl group is 5 to 30, one or more ring atoms are hetero-atoms, in particular, hetero-atoms selected from the group consisting of N, O, S, Se, and Si); a substituted or unsubstituted, condensed or uncondensed aryl group (in particular, the number of ring carbon atoms is 6 to 30); and a substituted or unsubstituted, condensed or uncondensed heteroaryl group (in particular, the number of ring atoms is 5 to 30, one or more ring atoms are hetero-atoms, in particular, hetero-atoms selected from the group consisting of N, O, S, Se, and Si). Preferably, $R_1$ and $R_2$ are each independently selected from the group consisting of a deuterium atom, a substituted or unsubstituted linear or branched alkyl group, a substituted or unsubstituted cycloalkyl group, in particular, a cycloalkyl group having 3 to 6 ring carbon atoms, and a substituted or unsubstituted aryl group, in particular, an aryl group having 6 to 30 ring carbon atoms. Examples of preferred aryl and heteroaryl groups for $R_1$ and $R_2$ are the same as those of aryl and heteroaryl groups for $Ar_1$ and $Ar_2$ described below.

In General Formula (1), a and b each independently represents an integer of 0 to 4. When a is 0 (zero), the substituent represented by $R_1$ in General Formula (1) does not exist. In this case, the borabenzene ring has no substituent, except a diarylamino-substituted phenyl group bonded thereto. When b is 0, the benzene ring to which $R_2$ in General Formula (1) is bonded has no substituent, except the boraphenyl group and $N(Ar_1)(Ar_2)$ groups bonded thereto. Preferably, a and b each independently represents 0 or 1, particularly preferably, both a and b are zero. When a and b are an integer of 1 to 4, a and b each independently represents a mono- to tetra-substituted structure.

In General Formula (1), $Ar_1$ and $Ar_2$ are identical to or different from each other, and are each independently a substituted or unsubstituted, uncondensed or condensed aryl group having 6 to 30 ring carbon atoms, or a substituted or unsubstituted, uncondensed or condensed heteroaryl group having 5 to 30 ring atoms. In particular, $Ar_1$ and $Ar_2$ are preferably each independently selected from the group consisting of substituted or unsubstituted phenyl group, biphenyl group, terphenyl group, fluorenyl group, spirobifluorenyl group, naphthyl group, anthracenyl group, phenanthrenyl group, fluoranthenyl group, pyrenyl group, chrysenyl group, triphenylenyl group, perylenyl group, indenyl group, benzoindenyl group, pyrrolyl group, indolyl group, carbazolyl group, furanyl group, benzofuranyl group, dibenzofuranyl group, thiophenyl group, benzothiophenyl group, dibenzothiophenyl group, imidazolyl group, benzoimidazolyl group, triazolyl group, oxazolyl group, oxadiazolyl group, thiazolyl group, thiadiazolyl group, pyridyl group, pyrimidyl group, triazinyl group, quinolinyl group and quinoxalinyl group, and are particularly preferably each independently selected from the group consisting of substituted or unsubstituted phenyl group, biphenyl group, terphenyl group, fluorenyl group, naphthyl group, and phenanthrenyl group. Among them, naphthyl may be either 1-naphthyl or 2-naphthyl and is preferably 1-naphthyl.

In addition, optionally, $Ar_1$ and $Ar_2$ may be bonded to each other via a linker selected from the group consisting of: a single bond; an alkylene group, in particular, an alkylene group having 1 to 6 carbon atoms, for example, methylene, ethylene; alkenylene, in particular, an alkenylene group having 2 to 6 carbon atoms, for example, a —CH=CH— group; —O—; —S—; an alkyl-N group (wherein the alkyl is a linear, branched or cyclic alkyl group having 1 to 6 carbon atoms); an aryl-N group (wherein the aryl is a uncondensed or condensed aryl group having 6 to 30 ring carbon atoms); a dialkyl Si group (wherein the alkyl is a linear, branched or cyclic alkyl group having 1 to 6 carbon atoms); and a diaryl Si group (wherein the aryl is a uncondensed or condensed aryl group having 6 to 30 ring carbon atoms).

In General Formula (1), when $R_1$, $R_2$, $Ar_1$, and $Ar_2$ are groups having a substituent, the substituent is preferably each independently selected from the group consisting of a deuterium atom; a halogen atom, for example, fluorine, chlorine or bromine; a cyano group; a nitro group; a linear or branched alkyl (for example, methyl, ethyl, n-propyl, isopropyl, n-butyl, isobutyl, tert-butyl, pentyl or hexyl) group having 1 to 6 carbon atoms; a cycloalkyl (for example, cyclopropyl, cyclobutyl, cyclopentyl or cyclohexyl) group having 3 to 6 carbon atoms; an alkoxy group having 1 to 6 carbon atoms (for example, an alkoxy group having an alkyl moiety selected from the aforementioned alkyl and cycloalkyl groups); an aryl group having 6 to 30 ring carbon atoms; a heteroaryl group having 5 to 30 ring atoms; an aryloxy group having 6 to 30 ring carbon atoms; a heteroaryloxy group having 5 to 30 ring atoms; a mono- or di-substituted amino group having an aryl group having 6 to 30 ring carbon atoms or a heteroaryl group having 5 to 30 ring atoms as a substituent; and a triarylsilyl or triheteroarylsilyl group having an aryl group having 6 to 30 ring carbon atoms or a heteroaryl group having 5 to 30 ring atoms as a substituent. The aryl and heteroaryl of these groups are preferably selected from groups mentioned as options for $Ar_1$ and $Ar_2$.

When $R_1$, $R_2$, $Ar_1$, and $Ar_2$ have a substituent, the substituent is preferably each independently selected from the group consisting of a deuterium atom, an aryl group having 6 to 30 ring carbon atoms, a monoarylamino group or diarylamino group (wherein the aryl group is an aryl group having 6 to 30 ring carbon atoms), and a triarylsilyl group (wherein the aryl group is an aryl group having 6 to 30 ring carbon atoms). Particularly preferably, the substituent is selected from the group consisting of a deuterium atom, an aryl group having 6 to 30 ring carbon atoms, a monoarylamino or diarylamino group (wherein the aryl group is an aryl group having 6 to 30 ring carbon atoms), and a triarylsilyl group (wherein the aryl group is an aryl group having 6 to 30 ring carbon atoms). Examples of the aryl moieties of these substituents include examples of aryl groups specifically mentioned as options for $Ar_1$ and $Ar_2$. The aryl moieties of these substituents are particularly preferably independently selected from the group consisting of phenyl group, biphenyl group, terphenyl group, fluorenyl group, naphthyl group, and phenanthrenyl group.

R1, R2, Ar1, Ar2, a, and b in General Formula (1) described above may be used in any combination within the scope of all embodiments mentioned in the present specification.

In a preferred embodiment of the compound represented by General Formula (1), in a case wherein R1 and/or R2 exist, R1 and R2 are each independently selected from the group consisting of a deuterium atom, a substituted or unsubstituted linear or branched alkyl group, a substituted or unsubstituted cycloalkyl group, and a substituted or unsubstituted aryl group, and Ar1 and Ar2 are each independently selected from the group consisting of substituted or unsubstituted, phenyl group, biphenyl group, terphenyl group, fluorenyl group, spirobifluorenyl group, naphthyl group, anthracenyl group, phenanthrenyl group, fluoranthenyl group, pyrenyl group, chrysenyl group, triphenylenyl group, perylenyl group, indenyl group, benzoindenyl group, pyrrolyl group, indolyl group, carbazolyl group, furanyl group, benzofuranyl group, dibenzofuranyl group, thiophenyl group, benzothiophenyl group, dibenzothiophenyl group, imidazolyl group, benzoimidazolyl group, triazolyl group, oxazolyl group, oxadiazolyl group, thiazolyl group, thiadiazolyl group, pyridyl group, pyrimidyl group, triazinyl group, quinolinyl group and quinoxalinyl group. In addition, preferably, Ar1 and Ar2 are each independently selected from the group consisting of substituted or unsubstituted phenyl group, biphenyl group, terphenyl group, fluorenyl group, naphthyl group, and phenanthrenyl group. The meanings of alkyl group, cycloalkyl group, and aryl group for R1 and R2 are defined as above in R1 and R2, and substituents that R1 and R2 may optionally have are defined as above. Preferred substituents that R1, R2, Ar1, and Ar2 may optionally have are for example selected from the group consisting of a deuterium atom, an aryl group having 6 to 30 ring carbon atoms, a monoarylamino group or diarylamino group (wherein the aryl group is an aryl group having 6 to 30 ring carbon atoms), and a triarylsilyl group (wherein the aryl group is an aryl group having 6 to 30 ring carbon atoms). Examples of aryl moieties of the substituents include examples of aryl groups specifically mentioned as options for Ar1 and Ar2. Particularly preferably, the aryl moieties of these substituents are each independently selected from the group consisting of phenyl group, biphenyl group, terphenyl group, fluorenyl group, naphthyl group, and phenanthrenyl group.

In General Formula (1), a=0 and b=0; a=0 and b=1 or 2, in particular, b=1; a=1 or 2, in particular, a=1 and b=0; or a=1 or 2, in particular, a=1 and b=1 or 2, in particular, b=2, R1 and R2 are each independently selected from the group consisting of a deuterium atom, an unsubstituted alkyl group having 1 to 6 carbon atoms, an unsubstituted cycloalkyl group having 3 to 6 carbon atoms, an unsubstituted uncondensed or condensed aryl group having 6 to 30 ring carbon atoms, and an unsubstituted diarylamino group (wherein the aryl group independently represents an unsubstituted uncondensed or condensed aryl group having 6 to 30 ring carbon atoms), and Ar1 and Ar2 are particularly preferably each independently selected from the group consisting of substituted or unsubstituted, in particular, unsubstituted phenyl group, biphenyl group, terphenyl group, fluorenyl group, naphthyl group, and phenanthrenyl group.

The more preferred compound is a compound of General Formula (1) wherein a=0 and b=0 and thus substituents R1 and R2 do not exist, and Ar1 and Ar2 are each independently selected from the group consisting of phenyl group, biphenyl group, terphenyl group, fluorenyl group, naphthyl group and phenanthrenyl group.

Preferred examples of the compound represented by General Formula (1) include compounds given below, but the present specification is not limited thereto.

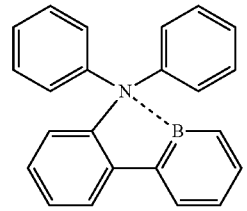

Compound 1

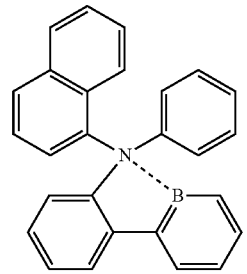

Compound 2

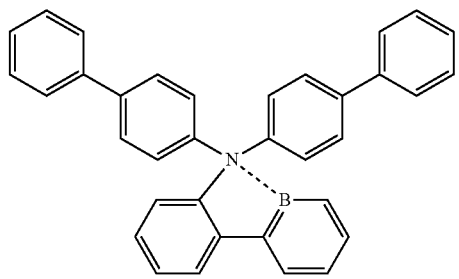

Compound 3

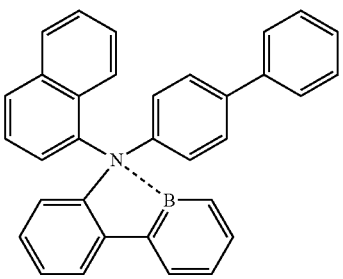

Compound 4

In addition, the present specification provides an organic material for an organic electronic device including the compound of General Formula (1). Particularly preferably, the organic electronic device is an organic electroluminescent device (organic EL device). When the compound of the present specification is used as an organic material for an organic electronic device, the compound may be used singly or in combination of two or more. In addition, the compound of the present specification may be used in combination with other compounds.

The organic material is preferably a hole transport material. Accordingly, another embodiment of the present specification provides a hole transport material for an organic electronic device including the compound of General Formula (1). The organic electronic device is particularly preferably an organic electroluminescent device (organic EL device). Use of the hole transport material in the present specification also includes use thereof as a hole injection material. The reason for this is that holes injected into the hole injection layer can be transported to other organic material layers adjacent to the hole injection layer and a material for the hole injection layer may thus substantially serve as a hole transport material as well.

Another embodiment of the present specification provides an organic electronic device including the compound of General Formula (1). The organic electronic device is particularly preferably an organic electroluminescent device (organic EL device).

Another embodiment of the present specification provides an organic electronic device including a hole transport layer wherein the hole transport layer includes the compound of General Formula (1) as a hole transport material. The organic electronic device is particularly preferably an organic electroluminescent device (organic EL device).

As a result of formation of a strong coordinate bond between a nitrogen atom of a diarylamino group serving as an electron donor and a boron atom serving as an electron acceptor in a borabenzene ring in the compound of General Formula (1) of the present specification, a 6-5-6-numbered ring structure is formed between the phenylborabenzene moiety and the nitrogen atom of the diarylamino group in General Formula (1), and this ring structure moiety has a similar electron structure to carbazole. The carbazole ring structure is known to have excellent hole transport property owing to high Ti level (for example, disclosed in Cited Document 2), and an organic compound including the carbazole ring structure has been widely used to date as a hole transport material for organic electronic devices, in particular, organic EL devices. The compound of General Formula (1) of the present specification is considered to have a similar electron structure to the carbazole ring structure and excellent hole transport property due to decreased electron density of nitrogen atom caused by electron acceptance property of the boron atom. In addition, by changing the substituent that the compound of General Formula (1) of the present specification has, the energy gap can be changed by regulation of the highest occupied molecular orbital (HOMO) level and/or lowest unoccupied molecular orbital (LUMO) level of the molecule. As a result, an optimal hole transport property can be imparted to a combination with other organic material used in the same organic EL device.

Organic Electronic Device

The organic electronic device of the present specification may be any electronic device well-known in the art using an organic material, is not limited to specific electronic devices, and may be a device selected from the group consisting of an organic light emitting device, an organic solar cell, an organic photoconductor (OPC) drum and an organic transistor. In particular, the device of the present specification is preferably an organic light emitting device, in particular, an organic EL device. The compound of General Formula (1) of the present specification is useful as a hole transport material for organic electronic device applications. The hole transport material of the present specification may be used for a hole injection layer, a hole transport layer, a host for a light emitting layer, an electron blocking layer, an exciton blocking layer and the like, in an organic electronic device.

Organic Electroluminescent Device (Organic EL Device)

The organic EL device generally includes a first electrode, a second electrode and one or more organic material layers interposed between the first and second electrodes, wherein at least one of the first and second electrodes is a light-transmitting electrode. When holes and electrons are injected into the organic material layer from the anode and the cathode, respectively, upon application of a voltage between the two electrodes, the holes recombine with the electrons in the organic material layer and a light emitting material included in the organic material layer emits light using an energy of excitons generated upon recombination. The organic EL device has a structure in which light emission from the organic material layer is extracted in the light-transmitting electrode. The device structure of the organic EL device is not limited to one type and a variety of device structures are suggested. A variety of light emission types such as top-emission, bottom-emission and dual-emission types are known. The organic material layer of the organic EL device of the present specification may have a single layer structure including one layer, or a multilayer structure including two or more layers including a light emitting layer. When the organic material layer of the organic EL device of the present specification has a multilayer structure, it may, for example, have a structure in which a hole injection layer, a hole transport layer, a light emitting layer, an electron transport layer and the like are laminated. In addition, it is known that the characteristics of the organic EL device can be improved by providing various layers such as a planarization layer to planarize the electrode surface, a hole blocking layer, an electron blocking layer, an exciton blocking layer and the like. The compound of General Formula (1) of the present specification can be used in all light emission types and structures of organic EL devices. Accordingly, the light-emission type and structure of the organic EL device including the compound of General Formula (1) of the present specification are not particularly limited. In addition, fluorescence-type, phosphorescence-type, and delayed fluorescence-type organic EL devices are known depending on the luminescence mechanism of the light emitting material, but the compound of General Formula (1) of the present specification may be used for any type of organic EL device.

A general structure of an organic EL device is shown in the Figure. In the Figure, reference numeral "1" represents a substrate, reference numeral "2" represents an anode, reference numeral "3" represents a hole injection layer, reference numeral "4" represents a hole transport layer, reference numeral "5" represents an organic light emitting layer, reference numeral "6" represents an electron transport layer, and reference numeral "7" represents a cathode. The organic EL device having the structure shown in the Figure is typically referred to as a "forward (normal) organic EL device". The organic EL device of the present specification may have a forward (normal) structure, but is not limited thereto. Thus, the organic EL device of the present specification may have a reverse (inverted) structure of organic EL device, that is, a structure in which a substrate, a cathode, an electron transport layer, an organic light emitting layer, a hole transport layer, a hole injection layer and an anode are laminated in this order. In addition, some of the plurality of organic material layers may be omitted. In addition, the organic EL device of the present specification is not limited to the aforementioned device structure and may have any device structure well-known as a structure of organic EL devices.

The compound of General Formula (1) of the present specification may be used as an organic material for injecting and/or transporting holes, for a hole injection layer for injecting holes from an electrode to an organic material layer, a hole transport layer for transporting holes from the organic material layer, and a hole injection/transport layer serving as both the hole injection layer and the hole transport layer in the organic electronic device. In addition, the compound of General Formula (1) may be used as a material for an electron blocking layer, a material for an exciton blocking layer, and/or a host material for a light emitting layer. Accordingly, when the organic EL device according to the present specification includes an organic material layer having a multilayer structure, the compound of General Formula (1) may be used as a material for forming one or more layers selected from a hole injection layer, a hole transport layer, a light emitting layer, an electron blocking layer and an exciton blocking layer. When the compound is used for the light emitting layer, among them, it is preferably used as a host material for a light emitting dopant.

The organic EL device according to the present specification may be manufactured using well-known materials for organic EL devices in accordance with a well-known method for manufacturing an organic EL device, except that the compound of General Formula (1) is used for the organic material layer. For example, the organic EL device according to the present specification may be manufactured by depositing a metal, an alloy, a metal oxide having conductivity, or a combination thereof using a physical vapor deposition (PVD) method such as sputtering or e-beam evaporation to form an anode, forming, on the anode, an organic material layer including one or more layers selected from a hole injection layer, a hole transport layer, a light emitting layer and an electron transport layer, and then depositing a material for a cathode thereon. In addition to this method, in order to manufacture a reverse-structure organic EL device as described above, the organic EL device may be produced by sequentially depositing a cathode material, an organic material layer, an anode material on a substrate. In addition, some of the organic material layers may be omitted and at least one organic material layer other than the aforementioned organic material layers may be added.

A method for forming the organic material layer may be a solution method, for example, spin coating, dip coating, doctor blade coating, screen printing, ink jet printing, thermal transfer or the like. In addition, other organic material layers may be formed using a combination of a solution method with a deposition method.

Generally, a material having a high work function is preferably used as a material for the anode to facilitate injection of holes into the organic material layer. Specifically, examples of the anode material include, but are not limited to: metals such as vanadium, chromium, copper, zinc and gold, or alloys thereof; metal oxides, such as zinc oxide, indium oxide, indium tin oxide (ITO) and indium zinc oxide (IZO); combinations of a metal with oxide such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like.

Generally, the material for the cathode is preferably a material that has a low work function to facilitate injection of electrons into the organic material layer. Specific examples of the cathode material include, but are not limited to, metals such as magnesium, calcium, sodium, potassium, titanium, indium, yttrium, lithium, gadolinium, aluminum, silver, tin and lead, or alloys thereof; multilayer structure materials such as LiF/Al and $LiO_2$/Al, and the like.

The compound of General Formula (1) of the present specification may be used as a material for the hole injection layer. However, when the compound of General Formula (1) is used for a hole transport layer, a light emitting layer or the like, a compound other than the compound of General Formula (1) may be used as a material for the hole injection layer in conjunction with or instead of the compound of General Formula (1). Preferably, the hole injection material is a material favorably receiving holes from the anode at a low voltage, which has a highest occupied molecular orbital (HOMO) between the work function of the anode material and the HOMO of the organic material layer opposite to the anode adjacent to the hole injection layer. Specifically, examples of the hole injection material include, but are not limited to, metal-porphyrin, oligothiophene, arylamine-based organic substances, hexanitrilehexaazatriphenylene-based organic substances, quinacridone-based organic substances, perylene-based organic substances, anthraquinone, polyaniline- and polythiophene-based conductive polymers, and the like.

The compound of General Formula (1) of the present specification may be used as a material for the hole transport layer. However, when the compound of General Formula (1) is used for the hole injection layer, the light emitting layer or the like, a compound other than the compound of General Formula (1) may be used as the material for the hole transport layer in conjunction with or instead of the compound of General Formula (1). The hole transport material is a material that is capable of receiving holes from the anode or the hole injection layer and transporting the holes to the light emitting layer and is preferably a material having a high hole mobility. Specifically, examples of the hole transport material include, but are not limited to arylamine-based compounds, carbazole-based compounds, anthracene-based compounds, pyrene-based compounds, conductive polymers, block copolymers having both a conjugated moiety and a non-conjugated moiety, and the like.

The light emitting material is a material that is capable of receiving holes and electrons from the hole transport layer and the electron transport layer, respectively, and emitting visible light using an energy of excitons generated by recombination between the holes and electrons, and is preferably a material having excellent quantum efficiency for fluorescence or phosphorescence. Specifically, examples of the light emitting material include, but are not limited to: 8-hydroxy-quinolinealuminum complexes ($Alq_3$); carbazole-based compounds; dimerized styryl compounds; bis-methyl-8-hydroxyquinolineparaphenylphenolaluminum complexes (Balq); 10-hydroxybenzoquinoline-metal compounds; benzooxazole-, benzthiazole- and benzimidazole-based compounds; anthracene-based compounds; pyrene-based compounds; poly(p-phenylenevinylene)(PPV)-based polymers; spiro compounds; polyfluorene, rubrene; perylene-based compounds and the like. The light emitting layer may be formed with only a light emitting material or a combination of the light emitting material as a light emitting dopant with a host material.

The electron transport material is a material that is capable of favorably receiving electrons from the cathode and transporting electrons to the light emitting layer and is preferably a material having high electron mobility. Specifically, examples of the electron transport material include, but are not limited to: Al complexes of 8-hydroxyquinoline; complexes including $Alq_3$; organic radical compounds; hydroxyflavone-metal complexes; anthracene-based compounds; pyrene-based compounds; benzoxazole-, benzthiazol- and benzimidazole-based compounds; pyridine-based compounds; phenanthroline-based compounds; quinoline-based compounds; and quinazoline-based compounds. In addition, the electron transport layer may be also formed by doping these compounds with a metal or metal compound.

Apart from the aforementioned respective layers, if necessary, a layer selected from a planarization layer to make the electrode surface even, and a hole blocking layer, an electron blocking layer and an exciton blocking layer to confine holes, electrons and excitons, respectively, to the target light emitting layers, may be used in the organic EL device and this technology is well-known in the art. Other technologies associated with organic EL devices well-known in the art may be applied to the organic EL device including the compound of General Formula (1) of the present specification.

The compound of General Formula (1) according to the present specification is not limited to the organic EL device using the hole transport property and may be used as a material for other organic electronic devices, for example, organic solar cells, organic photoconductors, organic photosensors, organic transistors and the like. Operational principles and structures of these devices are well-known in the art. Hereinafter, results of Comparative Examples and preferred Examples will be provided for better understanding of the present specification, but the present specification is not limited to the following Examples.

MODE FOR INVENTION

Synthetic Example 1

1) Synthesis of Compound 1-A

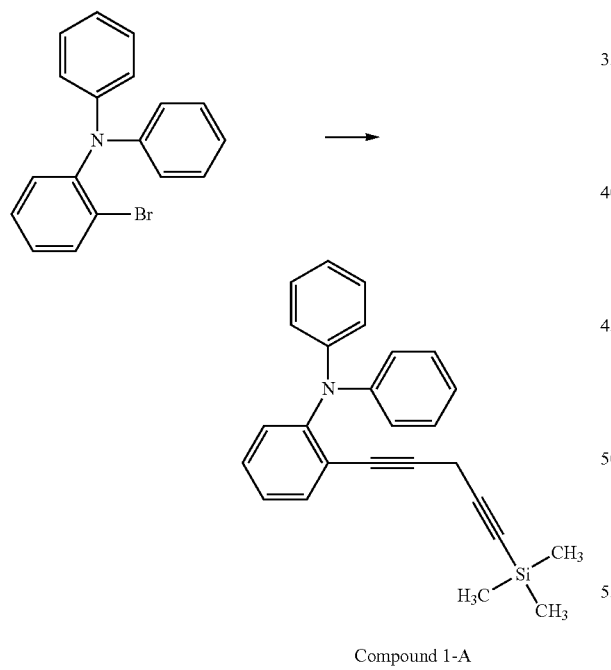

Compound 1-A

N,N-diphenyl-2-bromoaniline (20.0 g, 61.7 mmol) was dissolved in 250 ml of deoxygenated triethylamine in a 500 ml two-neck round bottom flask dried in an oven. A $PdCl_2(PPh_3)_2$ catalyst (0.433 g, 0.167 mmol) and a copper (I) iodide co-catalyst (0.118 g, 0.620 mmol) were added to this solution. The resulting mixture was stirred at room temperature under a nitrogen atmosphere for 15 minutes. Trimethylsilyl-1,4-pentadiyne (8.41 g, 61.7 mmol) was added to the mixture, followed by reacting under stirring at room temperature for 12 hours. Triethylamine was removed under reduced pressure to obtain an unpurified viscous residue. The residue was dissolved in ethyl acetate (200 ml), treated with saturated saline and anhydrous sodium sulfate ($Na_2SO_4$), adsorbed on neutral alumina, and then subjected to flash column chromatography using ethyl acetate:petroleum ether (1:9) to obtain a compound 1-A (19.2 g, 50.7 mmol).

2) Synthesis of Compound 1-B

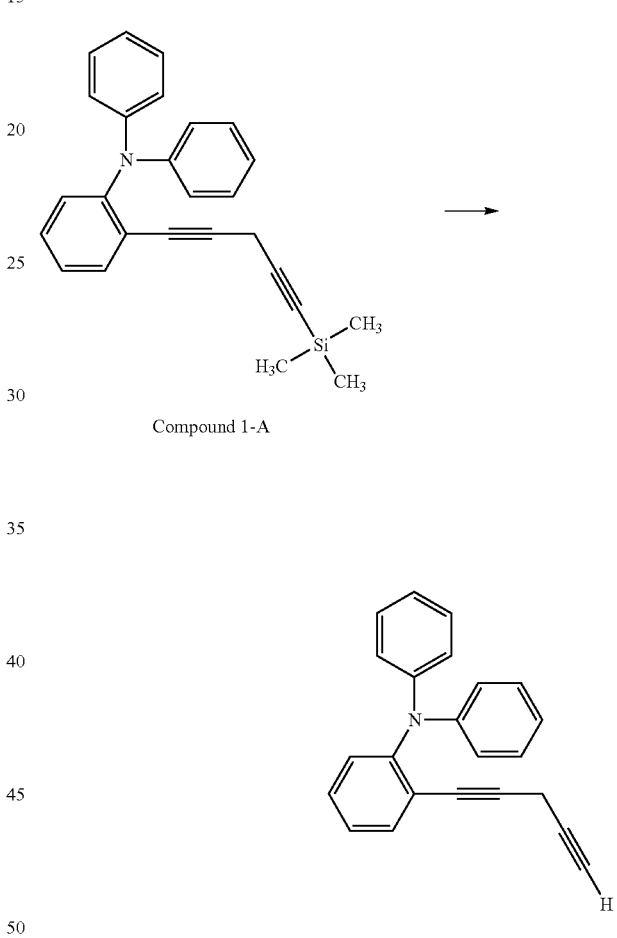

Compound 1-B

A 1M aqueous solution of sodium hydroxide (2.64 g, 66.0 mmol) was added to a solution of the compound 1-A (18.0 g, 47.5 mmol) in 200 ml of ethanol/THF (1:1). The resulting mixture was continuously stirred at room temperature for one hour. The organic solvent was evaporated under reduced pressure, and the residue was diluted in 50 ml of distilled water and extracted with $CH_2Cl_2$. The organic extract was treated with saline, dried over anhydrous $Na_2SO_4$, adsorbed on neutral alumina, and then subjected to flash column chromatography using ethyl acetate:petroleum ether (1:4) to obtain a compound 1-B (13.7 g, 44.6 mmol, yield 93.9%).

3) Synthesis of Compound 1-C

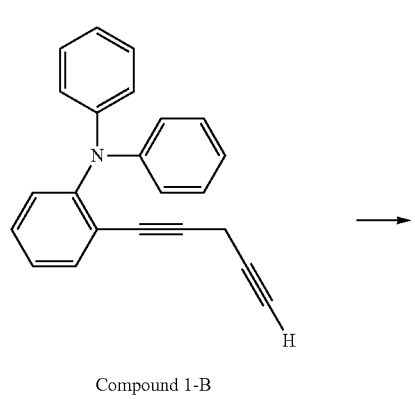

Compound 1-B

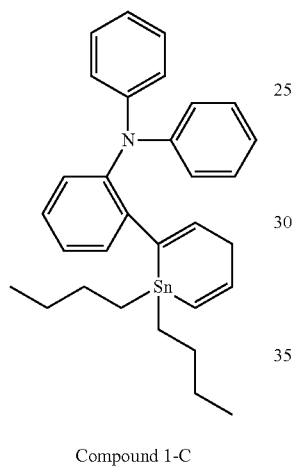

Compound 1-C

A solution of dibutyltin dichloride (12.4 g, 39.2 mmol) in 10 ml of toluene was charged in a 300 ml two-neck round bottom flask. Then, 30 ml of toluene was further added thereto. 5 g of polymethylhydrosiloxane was added to the resulting mixture and 5 g of silica gel was then added thereto. To the stirred solution, a solution of the compound 1-B (12.0 g, 39.1 mmol) in 25 ml of toluene was then added.

Then, a solution of potassium fluoride (12 g) in 20 ml of water was slowly added to the stirred mixture, and during addition, the temperature was maintained at a level lower than 30° C.

A solution of 2,2-azobis(isobutyronitrile) (0.34 g) in 10 ml of toluene was added to the resulting mixture at one time. The resulting mixture was then heated at 65° C. for 4 hours.

After being allowed to cool to room temperature, the reaction mixture was discharged into a pump through a centrifugal separator equipped with a 1 micron filter bag. The aqueous layer of the filter was separated. The organic layer was dried over MgSO$_4$ and filtered through a Celite pad into a distillation apparatus. The toluene was removed by distillation under reduced pressure to allow a compound 1-C to remain unpurified (21.3 g).

4) Synthesis of compound 1-D

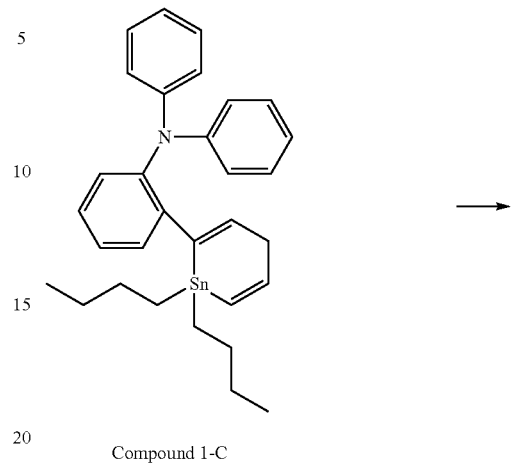

Compound 1-C

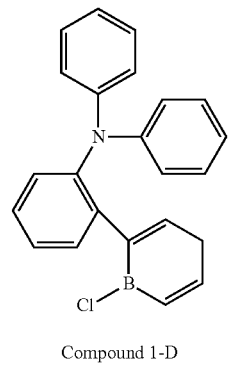

Compound 1-D

The unpurified compound 1-C was dissolved in 40 ml of CH$_2$Cl$_2$. The resulting solution was charged in a 300 ml two-neck round bottom flask and was cooled to −45° C. 100 ml of a 1M boron trichloride solution in CH$_2$C12 was slowly added to the solution over 4 hours, while maintaining the temperature at −25° C. After completion of addition, the resulting mixture was allowed to warm to room temperature over 2 to 3 hours. At this time, 20 ml of toluene was added to the mixture. Then, all CH$_2$C12 was removed under reduced pressure.

5) Synthesis of Compound 1

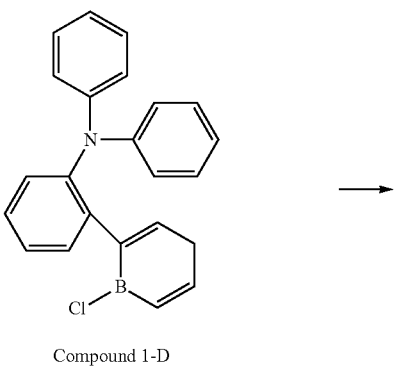

Compound 1-D

-continued

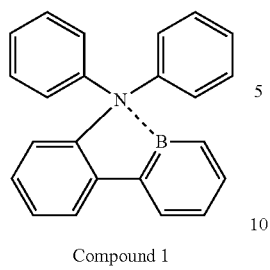

Compound 1

Sodium hydride (2.5 g, dried) was charged in a 300 ml two-neck round bottom flask equipped with a dry ice-acetone condenser, which had been dried and purged with argon. Subsequently, 10 ml of THF was added thereto and the resulting slurry was stirred. The flask was allowed to cool to 0° C. A solution of the compound 1-D in toluene was slowly added thereto while maintaining the temperature at a level lower than 5° C. As a result of addition of the solution of starting material over 4 to 5 hours, a hydrogen gas was generated. After addition of the entire starting material, the reaction mixture was allowed to warm to room temperature.

The liquid layer was then carefully transferred to a Schlenk filter and a second container while being careful to minimize movement of solids. The wet solids were washed with 500 ml of hexane and the supernatant was carefully removed in the same manner as above. The liquid remaining in the flask was removed by distillation under reduced pressure into a container cooled with dry ice.

The solid was adsorbed on neutral alumina and then subjected to flash column chromatography using ethyl toluene:hexane (1:2) to obtain a crude compound 1. The crude compound 1 was purified by sublimation to obtain a pure compound 1 (4.9 g, 14.8 mmol).

Synthetic Example 3

1) Synthesis of Compound 3-A

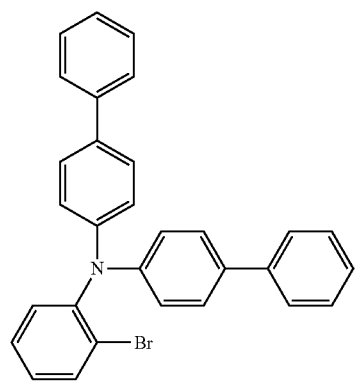

-continued

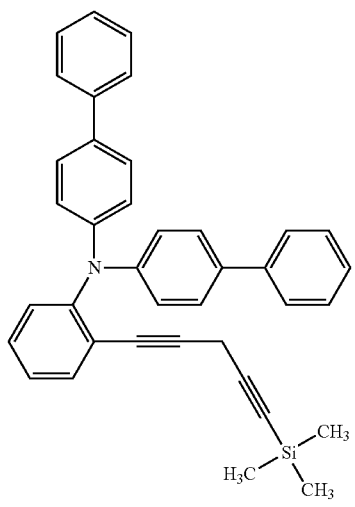

Compound 3-A

N,N-di(biphenyl)-2-bromoaniline (29.4 g, 61.7 mmol) was dissolved in 250 ml of deoxygenated triethylamine in a 500 ml two-neck round bottom flask dried in an oven. To the resulting solution, a $PdCl_2(PPh_3)_2$ catalyst (0.433 g, 0.617 mmol) and a copper (I) iodide co-catalyst (0.118 g, 0.620 mmol) were added. The resulting mixture was stirred at room temperature under a nitrogen atmosphere for 15 minutes. Trimethylsilyl-1,4-pentadiyne (8.41 g, 61.7 mmol) was added to the mixture, followed by reacting under stirring at room temperature for 12 hours. Triethylamine was removed under reduced pressure to obtain an unpurified viscous residue. The residue was dissolved in ethyl acetate (200 ml), treated with saturated saline, dried over anhydrous $Na_2SO_4$, adsorbed on neutral alumina, and then subjected to flash column chromatography using ethyl acetate:petroleum ether (1:9) to obtain a compound 3-A (26.9 g, 50.7 mmol).

2) Synthesis of Compound 3-B

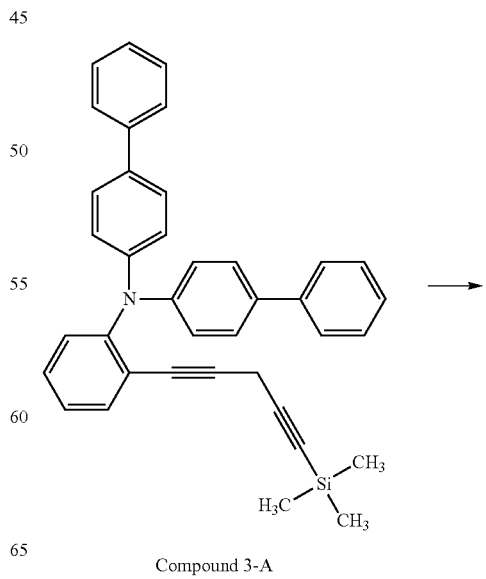

Compound 3-A

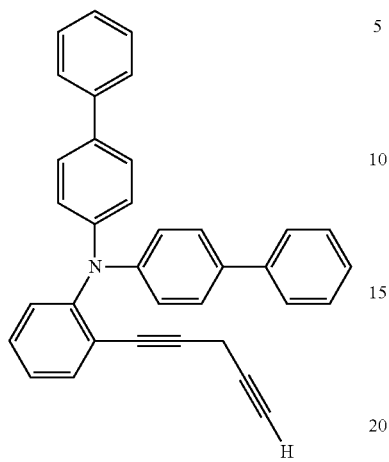

Compound 3-B

A 1M aqueous solution of sodium hydroxide (2.64 g, 66.0 mmol) was added to a solution of the compound 3-A in 200 ml of ethanol/THF (1:1). The resulting mixture was continuously stirred at room temperature for one hour. The organic solvent was evaporated under reduced pressure, and the residue was diluted in 50 ml of distilled water and extracted with $CH_2Cl_2$. The organic extract was treated with saline, dried over anhydrous $Na_2SO_4$, adsorbed on neutral alumina, and then subjected to flash column chromatography using ethyl acetate:petroleum ether (1:4) to obtain a compound 3-B (20.5 g, 44.6 mmol, yield 93.9%).

3) Synthesis of Compound 3-C

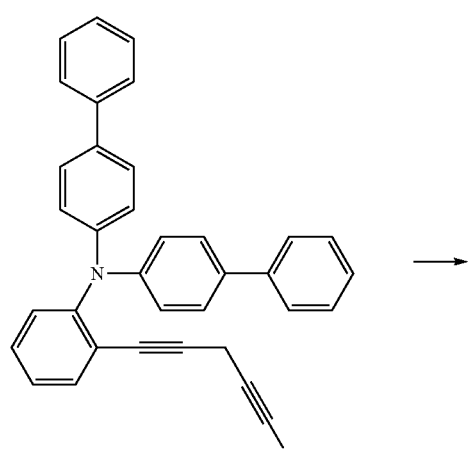

Compound 3-B

→

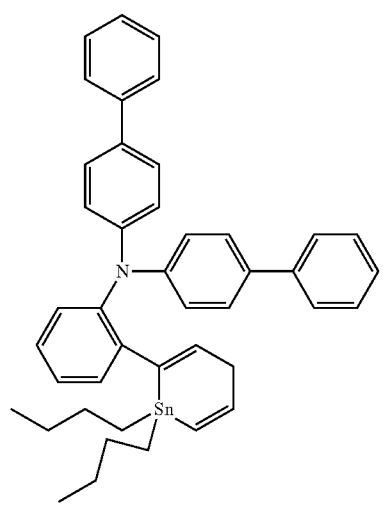

Compound 3-C

A solution of dibutyltin dichloride (12.4 g, 39.2 mmol) in 10 ml of toluene was charged in a 300 ml two-neck round bottom flask. Then, 30 ml of toluene was further added thereto. 5 g of polymethylhydrosiloxane was added to the resulting mixture and 5 g of silica gel was then added thereto. To the stirred solution, a solution of the compound 3-B (17.9 g, 39.1 mmol) in 25 ml of toluene was then added.

Then, a solution of potassium fluoride (12 g) in 20 ml of water was slowly added to the stirred mixture, and during addition, the temperature was maintained at a level lower than 30° C. The entirety of a solution of 2,2-azobis(isobutyronitrile) (0.34 g) in 10 ml of toluene was added to the resulting mixture at one time. The resulting mixture was then heated at 65° C. for 4 hours.

After being allowed to cool to room temperature, the reaction mixture was discharged into a pump through a centrifugal separator equipped with a 1 micron filter bag. The aqueous layer of the filter was separated. The organic layer was dried over $MgSO_4$, and filtered through a Celite pad into a distillation apparatus. The toluene was removed by distillation under reduced pressure to allow a compound 3-C to remain unpurified (23.3 g).

4) Synthesis of Compound 3-D

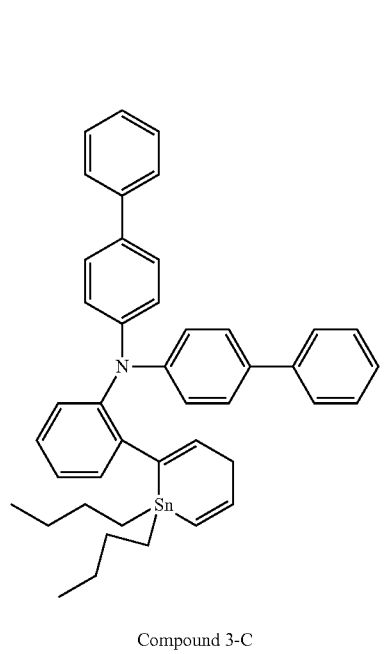

Compound 3-C

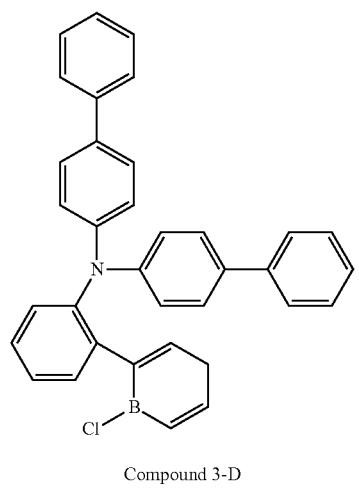

Compound 3-D

The unpurified compound 3-C was dissolved in 40 ml of CH$_2$Cl$_2$. The resulting solution was charged in a 300 ml two-neck round bottom flask and was cooled to −45° C. 100 ml of a 1M boron trichloride solution in CH$_2$Cl2 was slowly added to the solution over 4 hours, while maintaining the temperature at −25° C. After completion of addition, the resulting mixture was allowed to warm to room temperature over 2 to 3 hours. At this time, 20 ml of toluene was added to the mixture. Then, all CH$_2$Cl2 was removed under reduced pressure.

5) Synthesis of Compound 3

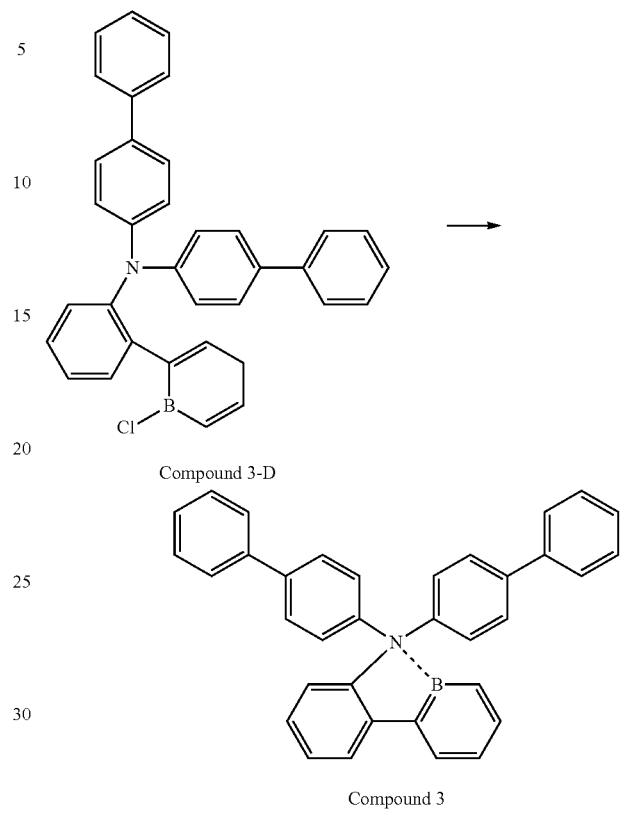

Compound 3-D

Compound 3

Sodium hydride (2.5 g, dried) was charged in a 300 ml two-neck round bottom flask equipped with a dry ice-acetone condenser, which had been dried and purged with argon. Subsequently, 10 ml of THF was added thereto and the resulting slurry was stirred. The flask was allowed to cool to 0° C. A solution of the compound 3-D in toluene was slowly added thereto while maintaining the temperature at a level lower than 5° C. As a result of addition of the solution of starting material was added over 4 to 5 hours, a hydrogen gas was generated. After addition of the entire starting material, the reaction mixture was allowed to warm to room temperature.

The liquid layer was then carefully transferred to a Schlenk filter and a second container while being careful to minimize movement of solids. The wet solids were washed with 500 ml of hexane and the supernatant was carefully removed in the same manner as above. The liquid remaining in the flask was removed by distillation under reduced pressure into a container cooled with dry ice.

The solid was adsorbed on neutral alumina, and then subjected to flash column chromatography using ethyl toluene:hexane (1:2) to obtain a crude compound 3. The crude compound 3 was purified by sublimation to obtain a pure compound 3 (6.97 g, 14.8 mmol).

Example 1

First, surface treatment with UV-ozone (O$_3$) was subjected to a previously patterned and cleaned ITO-glass substrate. The thickness of an ITO layer (first electrode) in the ITO-glass substrate was about 150 nm. After surface treatment, in order to form an organic material layer, the glass substrate was loaded on a deposition machine, and a hole injection layer, a hole transport layer (HTL), a light emitting layer and an electron transport layer were deposited at a vacuum degree of about $10^{-4}$ to about $10^{-5}$ Pa one by one.

The hole injection layer was formed to a layer thickness of about 60 nm using 4,4',4"-tris(N,N-2-naphthylamino) triphenylamine (2-TNATA). The hole transport layer (HTL) was formed to a layer thickness of about 30 nm using the compound 3 (synthesized above). The light emitting layer was formed to a layer thickness of about 25 nm using 9,10-di(2-naphthyl)anthracene (ADN) as a light emitting host material and 2,5,8,11-tetra-t-butylperylene (TBP) as a dopant material. The doping amount of dopant material was 3% by weight, based on the total amount of the host material. The electron transport layer was formed to a layer thickness of about 25 nm using $Alq_3$.

Subsequently, the substrate was transferred to a deposition machine to form a metal layer, and an electron injection layer and a second electrode were deposited at a vacuum level of about $10^{-4}$ to about $10^{-5}$ Pa, to manufacture an organic EL device. The electron injection layer was formed to a layer thickness of about 1 nm using lithium fluoride (LiF) and the second electrode was formed to a layer thickness of about 100 nm using aluminum (Al). As a result, the organic EL device of Example 1 was manufactured by the aforementioned method.

Comparative Example 1

The organic EL device according to Comparative Example 1 was manufactured in substantially the same manner as in Example 1, except that a hole transport layer (HTL) was formed using N,N'-di(naphthyl-1-yl)-N,N'-diphenyl-4,4'-benzidine (NPB).

Test Results

Test results of the organic EL devices manufactured in accordance with Example 1 and Comparative Example 1 are shown in Table 1. Then, the light emitting properties of the produced organic EL device were evaluated at a current density of 10 $mA/cm^2$ using C9920-11 available from Hamamatsu Photonics K.K., as a brightness light distribution characteristics measurement system.

TABLE 1

|  | Material used for HTL | Luminous efficacy (cd/A) |
| --- | --- | --- |
| Example 1 | Compound 3 | 7.5 |
| Comparative Example 1 | NPB | 6.0 |

As can be seen from test results shown in Table 1, the organic EL device of Example 1 including the hole transport layer (HTL) formed using the compound 3 according to the embodiment of the present specification exhibited improved luminous efficacy, as compared to Comparative Example 1.

INDUSTRIAL APPLICABILITY

The compound of the present specification can be used as a hole transport material for an organic photoelectric device, in particular, an organic EL device.

The invention claimed is:

1. A compound comprising: General Formula (1)

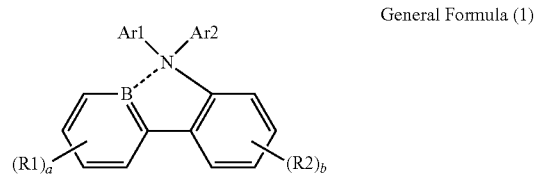

General Formula (1)

wherein R1 and R2 are identical to or different from each other, and each independently is a substituent at any substitutable position on a borabenzene or benzene ring selected from the group consisting of: a deuterium atom; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted trialkylsilyl group; a substituted or unsubstituted triarylsilyl group; a substituted or unsubstituted dialkyl boron group; a substituted or unsubstituted diarylboron group; a substituted or unsubstituted mono- or di-alkylamino group; a substituted or unsubstituted mono- or di-aralkylamino group; a substituted or unsubstituted mono- or di-arylamino group; a substituted or unsubstituted mono- or di-heteroarylamino group; a substituted or unsubstituted, condensed or uncondensed aryl group; and a substituted or unsubstituted, condensed or uncondensed heteroaryl group;

a and b each independently is an integer of 0 to 4;

Ar1 and Ar2 are identical to or different from each other, and each independently is a substituted or unsubstituted, uncondensed or condensed aryl group having 6 to 30 ring carbon atoms or a substituted or unsubstituted, uncondensed or condensed heteroaryl group having 5 to 30 ring atoms; and Ar1 and Ar2 are optionally bonded to each other via a linker selected from the group consisting of a single bond, an alkylene group, an alkenylene group, —O—, —S—, an alkyl-N group, an aryl-N group, a dialkyl Si group, and a diaryl Si group.

2. The compound of claim 1, wherein both a and b are 0.

3. The compound of claim 1, wherein R1 and R2 are each independently selected from the group consisting of: a deuterium atom, a substituted or unsubstituted alkyl group, a substituted or unsubstituted cycloalkyl group, and a substituted or unsubstituted, condensed or uncondensed aryl group; and Ar1 and Ar2 are each independently selected from the group consisting of substituted or unsubstituted: phenyl group, biphenyl group, terphenyl group, fluorenyl group, spirobifluorenyl group, naphthyl group, anthracenyl group, phenanthrenyl group, fluoranthenyl group, pyrenyl group, chrysenyl group, triphenylenyl group, perylenyl group, indenyl group, benzoindenyl group, pyrrolyl group, indolyl group, carbazolyl group, furanyl group, benzofuranyl group, dibenzofuranyl group, thiophenyl group, benzothiophenyl group, dibenzothiophenyl group, imidazolyl group, benzoimidazolyl group, triazolyl group, oxazolyl group, oxadiazolyl group, thiazolyl group, thiadiazolyl group, pyridyl group, pyrimidyl group, triazinyl group, quinolinyl group and quinoxalinyl group.

4. The compound of claim 3, wherein Ar1 and Ar2 are each independently selected from the group consisting of substituted or unsubstituted: phenyl group, biphenyl group, terphenyl group, fluorenyl group, naphthyl group, and phenanthrenyl group.

5. The compound of claim 1, wherein, when R1, R2, Ar1, and Ar2 are groups having a substituent, the substituent of each substituted group is independently selected from the group consisting of: a deuterium atom, a halogen atom, a cyano group, a nitro group, a linear or branched alkyl group having 1 to 6 carbon atoms, a cycloalkyl group having 3 to 6 carbon atoms, an alkoxy group having 1 to 6 carbon atoms, an aryl group having 6 to 30 ring carbon atoms, a heteroaryl group having 5 to 30 ring atoms, an aryloxy group having 6 to 30 ring carbon atoms, a heteroaryloxy group having 5 to 30 ring atoms, a mono- or di-substituted amino group having an aryl group having 6 to 30 ring carbon atoms or a heteroaryl group having 5 to 30 ring atoms as a substituent, and a triarylsilyl or triheteroarylsilyl group having an aryl group having 6 to 30 ring carbon atoms or a heteroaryl group having 5 to 30 ring atoms as a substituent.

6. The compound of claim 5, wherein the substituent of each substituted group is selected from the group consisting of: a deuterium atom, an aryl group having 6 to 30 ring carbon atoms, a monoarylamino or diarylamino group in which the aryl group is an aryl group having 6 to 30 ring carbon atoms, and a triarylsilyl group in which the aryl group is an aryl group having 6 to 30 ring carbon atoms.

7. The compound of claim 1, wherein the compound of General Formula (1) is selected from the group consisting of:

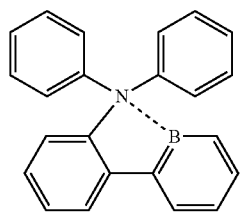

Compound 1

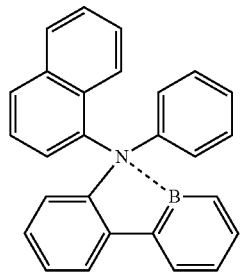

Compound 2

-continued

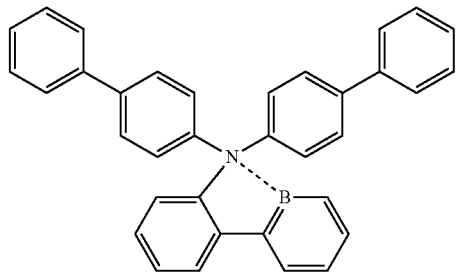

Compound 3

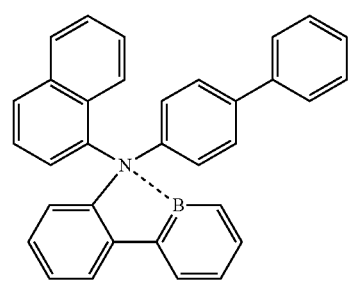

Compound 4

8. An organic material for an organic electronic device comprising the compound according to claim 1.

9. The organic material of claim 8, wherein the organic electronic device is an organic electroluminescent device.

10. A hole transport material for an organic electronic device comprising the compound according to claim 1.

11. The hole transport material of claim 10, wherein the organic electronic device is an organic electroluminescent device.

12. An organic electronic device comprising the compound according to claim 1.

13. The organic electronic device of claim 12, wherein the organic electronic device is an organic electroluminescent device.

14. An organic electronic device comprising:
a hole transport layer,
wherein the hole transport layer comprises the compound of claim 1 as a hole transport material.

15. The organic electronic device of claim 14, wherein organic electronic device is an organic electroluminescent device.

* * * * *